(12) United States Patent
Qu et al.

(10) Patent No.: US 11,131,930 B2
(45) Date of Patent: Sep. 28, 2021

(54) FEMALE MOLD AND METHOD FOR MANUFACTURING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Lianjie Qu, Beijing (CN); Fei Wang, Beijing (CN); Yonglian Qi, Beijing (CN); Hebin Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 371 days.

(21) Appl. No.: 15/796,440

(22) Filed: Oct. 27, 2017

(65) Prior Publication Data
US 2018/0275520 A1    Sep. 27, 2018

(30) Foreign Application Priority Data

Mar. 21, 2017   (CN) .......................... 201710171849.9

(51) Int. Cl.
*B29C 33/38*    (2006.01)
*G03F 7/00*    (2006.01)
(Continued)

(52) U.S. Cl.
CPC ........ *G03F 7/2039* (2013.01); *B29C 33/3842* (2013.01); *B29C 33/42* (2013.01);
(Continued)

(58) Field of Classification Search
CPC ....... B29C 33/42; B29C 33/38; G03F 7/2039; G03F 7/00; B29L 2031/756
(Continued)

(56) References Cited

U.S. PATENT DOCUMENTS 4,788,015 A * 11/1988 Sakai .................. B29C 35/0888
264/1.33
6,379,773 B1 * 4/2002 Katoh ...................... B32B 3/02
205/67
(Continued)

FOREIGN PATENT DOCUMENTS

CN    1821880 A      8/2006
CN    1935627 A *    3/2007
(Continued)

OTHER PUBLICATIONS

Non Patent Literature 1; "Photoresist"; Retrieved from https://en.wikipedia.org/wiki/Photoresist (Year: 2020).*
(Continued)

*Primary Examiner* — Francisco W Tschen
*Assistant Examiner* — Edgaredmanuel Troche
(74) *Attorney, Agent, or Firm* — Kinney & Lange, P.A.

(57) ABSTRACT

A method for manufacturing a female mold is provided in the embodiments of the disclosure, comprising: providing a substrate; forming a substrate layer of the female mold on the substrate; forming on the substrate layer of the female mold a mask layer which is adapted to exposure by an X-ray; and exposing the substrate layer of the female mold to the X-ray from a side of the mask layer away from the substrate. A direction in which the X-ray irradiates is inclined at a predetermined oblique angle to the substrate layer of the female mold, in the process of exposing to the X-ray. Besides, a female mold is also provided.

11 Claims, 8 Drawing Sheets

(51) Int. Cl.
  *B29C 33/42* (2006.01)
  *G03F 7/20* (2006.01)
  *B29L 31/00* (2006.01)

(52) U.S. Cl.
  CPC .......... *G03F 7/0002* (2013.01); *G03F 7/2002* (2013.01); *G03F 7/2022* (2013.01); *B29L 2031/756* (2013.01)

(58) Field of Classification Search
  USPC ............................ 264/473, 488; 425/98, 521
  See application file for complete search history.

(56) References Cited

U.S. PATENT DOCUMENTS

| | | | |
|---|---|---|---|
| 9,523,796 B2 * | 12/2016 | Onomoto | ................. G02B 1/18 |
| 2006/0103827 A1 | 5/2006 | Derksen | |
| 2015/0158243 A1 * | 6/2015 | Arai | ..................... G03F 7/0002 |
| | | | 264/488 |

FOREIGN PATENT DOCUMENTS

| | | | | |
|---|---|---|---|---|
| CN | 1935627 | A | | 3/2007 |
| CN | 1979341 | A | | 6/2007 |
| CN | 101226343 | A | | 7/2008 |
| CN | 101320215 | A | | 12/2008 |
| JP | 2010205553 | A | | 9/2010 |
| KR | 20030030598 | A | * | 4/2003 |
| KR | 20030030598 | A | | 4/2003 |
| TW | 200602816 | A | | 1/2006 |
| WO | WO-2005098486 | A1 | * | 10/2005 ........... G02B 5/1857 |

OTHER PUBLICATIONS

Cai Xinchang Zhang; "Micro structure and its manufacturing method"; (2005); English Translation of CN1935627A (Year: 2005).*
Lee Seung; "Method for Manufacturing Triangular Riblet and the Mold by Using LIGA Process"; (2003); English Translation of KR20030030598A (Year: 2003).*
Machine English Translation of WO2005098486A1 (Year: 2005).*
Fourth Chinese Office Action, for Chinese Patent Application No. 201710171849.9, dated Apr. 22, 2019, 16 pages.
Second Chinese Office Action, for Chinese Patent Application No. 201710171849.9, dated May 11, 2018, 14 pages.
First Chinese Office Action, for Chinese Patent Application No. 201710171849.9, dated Dec. 1, 2017, 15 pages.
Fifth Chinese Office Action, for Chinese Patent Application No. 201710171849.9, dated Sep. 24, 2019, 22 pages.
Sixth Chinese Office Action dated May 29, 2020, for Chinese Patent Application No. 201710171849.9, , 19 pages.

* cited by examiner

FEMALE MOLD AND METHOD FOR MANUFACTURING THE SAME

CROSS-REFERENCE TO RELATED APPLICATION

The present disclosure claims the benefit of Chinese Patent Application No. 201710171849.9 filed on Mar. 21, 2017 in the State Intellectual Property Office of China, the whole disclosure of which is incorporated herein by reference.

BACKGROUND

Technical Field

Embodiments of the present disclosure relate to the technical field of the manufacturing technology of a micro-structure device, and especially to a female mold adapted to manufacture a micro-structure device and a method for manufacturing the same.

Description of Related Art

Nowadays, by way of example, micro manufacturing technologies such as LIGA process, lithography process, electroforming process, and micro molding mass production technology and the like are used to manufacture various micro-structure devices, such as lenses used in backlight modules of a display device, and polarizers, and the like.

Recently, attention has been paid increasingly to a nano-imprint lithography technology which is adapted to micro-structure manufacturing, by those skilled in the art. In the nano-imprint lithography technology, both shape and accuracy of an imprinted pattern essentially depend on those of a female mold therefor. However, generally speaking, with a female mold manufactured by a traditional manufacturing process, only patterns of vertical constructions may be obtained. Even if a structure provided with an inclined angle may be obtained at present based on the principle of light diffraction, however, since only a structure having a relatively small high-aspect-ratio or a relatively small depth may be formed with the manufacturing process which takes advantages of light diffusion, it may be impossible to implement an accurate control on the inclined angle of the structure thus manufactured.

SUMMARY

The embodiments of the present disclosure have been made to overcome or alleviate at least one aspect of the above mentioned disadvantages and/or shortcomings in the prior art, by providing a method for manufacturing a female mold, and a female mold.

Following technical solutions are adopted in exemplary embodiments of the invention for achieving the above desired technical purposes.

According to an aspect of an exemplary embodiment of the present disclosure, there is provided a method for manufacturing a female mold, comprising following steps: providing a substrate; forming a substrate layer of the female mold on the substrate; forming on the substrate layer of the female mold a mask layer which is adapted to exposure by an X-ray; and exposing the substrate layer of the female mold to the X-ray from a side of the mask layer away from the substrate; and in a direction in which the X-ray irradiates is inclined at a predetermined oblique angle to the substrate layer of the female mold, in the process of exposing to the X-ray.

In an embodiment of the disclosure, the step of exposing the substrate layer of the female mold to the X-ray from a side of the mask layer away from the substrate comprises: irradiating the substrate layer of the female mold by the X-ray in a direction in which the X-ray irradiates is inclined at a first predetermined oblique angle to the substrate layer of the female mold to implement a first exposure; and irradiating the substrate layer of the female mold by the X-ray in a direction in which the X-ray irradiates is inclined at a second predetermined oblique angle to the substrate layer of the female mold to implement a second exposure; and the first predetermined oblique angle is not equal to the second predetermined oblique angle.

In an embodiment of the disclosure, the mask layer comprises a plurality of light-transmitting regions, and a plurality of light-shielding regions which are configured to block the X-ray from passing therethrough, and the step of exposing the substrate layer of the female mold to the X-ray from a side of the mask layer away from the substrate further comprises: adjusting the first predetermined oblique angle and the second predetermined oblique angle such that, within an identical light-transmitting region of the mask layer, there is a unexposed area formed between two exposed areas on the substrate layer of the female mold both of which are processed by the first exposure and the second exposure respectively In an embodiment of the disclosure, a dimension of the unexposed area in a direction parallel to the substrate is less than a dimension of one of the exposed areas on the mask layer in the direction parallel to the substrate.

In an embodiment of the disclosure, the first predetermined oblique angle is an acute angle which is less than 90°, while the second predetermined oblique angle is an obtuse angle which is larger than 90° but less than 180°.

In an embodiment of the disclosure, a sum of the first predetermined oblique angle and the second predetermined oblique angle is equal to 180°.

In an embodiment of the disclosure, the step of forming on the substrate layer of the female mold a mask layer which is adapted to exposure by an X-ray comprises: forming an X-ray resistance material layer on the substrate layer of the female mold; and forming patterns of the X-ray resistance material layer by a single patterning process so as to form the mask layer comprising the plurality of light-transmitting regions and the plurality of light-shielding regions.

In an embodiment of the disclosure, the step of forming patterns of the X-ray resistance material layer by a single patterning process comprises: applying a photoresist on the X-ray resistance material layer; forming patterns of the photoresist by exposure and development processes; etching the X-ray resistance material layer; and removing the photoresist.

In an embodiment of the disclosure, the photoresist applied on the X-ray resistance material layer is an UV photoresist; and in the step of forming patterns of the photoresist by exposure and development processes, the UV photoresist which is applied is exposed to an UV-light.

In an embodiment of the disclosure, following the step of exposing the substrate layer of the female mold to the X-ray from a side of the mask layer away from the substrate, the method further comprises: etching the mask layer while developing the substrate layer of the female mold simultaneously; or etching the mask layer and then developing the substrate layer of the female mold subsequently.

In an embodiment of the disclosure, the substrate layer of the female mold is formed by one of a positive photoresist and a negative photoresist which is adapted to the exposure process by the X-ray.

In an embodiment of the disclosure, the substrate layer of the female mold formed on the substrate has a thickness over 5 μm.

In an embodiment of the disclosure, in the step of forming patterns of the photoresist by exposure and development processes, the UV photoresist which is applied is exposed by an exposure way of a projection exposure in addition to the UV light.

According to another aspect of an exemplary embodiment of the present disclosure, there is provided a female mold which is manufacture by any one method as in above embodiments.

According to yet another aspect of an exemplary embodiment of the present disclosure, there is provided a female mold, comprising: a substrate; and a plurality of molding portions formed on the substrate; and the plurality of molding portions are spaced apart at a predetermined distance from one another, and each of the plurality of molding portions is provided with at least one side portion which is inclined relative to a plane in which the substrate lies.

In an embodiment of the disclosure, each of the plurality of molding portions has a thickness over 5 μm; or the plurality of molding portions comprise one of a positive photoresist and a negative photoresist which is adapted to the exposure process by the X-ray.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

Figure 1:
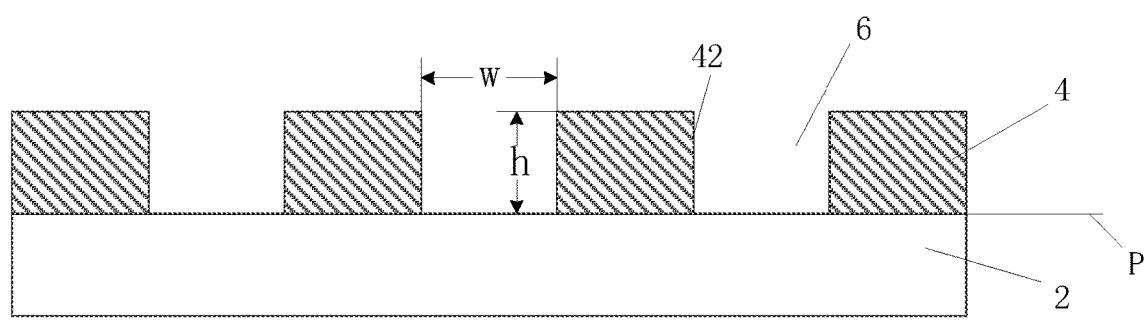
FIG. 1 illustrates a structural schematic view of a female mold.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It's important to note that, the expressions such as "on", "above" or "over" as mentioned in the disclosure, may mean that one layer is formed directly or provided onto another layer; alternatively, by way of example, these expressions may mean that one layer is indirectly formed or provided onto another layer, i.e., there may exist other layer or layers sandwiched therebetween.

Since the dimensions of various structures to which the embodiments of the disclosure pertain are relatively tiny, then, for clarity, respective dimension and shape of each component in the drawings are only intended to exemplarily illustrate the contents of the disclosure, rather than to demonstrate the practical dimension or proportion of components of the disclosure.

The expressions "micro-structure" or "micro-structure device" in the disclosure generally refer to structures or devices provided with dimensions of micrometer or nanometer scale, such as Lens used in backlight modules of a display device, and polarizer, and the like.

For convenience in depiction, technical solutions of the disclosure are depicted hereinafter by taking the nano-imprint lithography technology for example; however, it may be understood by those skilled in the art that, the technical solutions of the disclosure may not be limited to applications of the nano-imprint lithography technology.

In the nano-imprint lithography technology, pattern or patterns of micro structures may be imprinted by a female mold. FIG. 1 illustrates a structural schematic view of a female mold. As illustrated, by way of example, the female mold comprises a substrate 2 and a plurality of molding portions 4. By the nano-imprint lithography, patterns of the plurality of molding portions 4 are transferred onto a device on which the micro structures are to be formed, so as to form the micro structures. As illustrated in FIG. 1, between two adjacent molding portions 4, there is formed a trench portion 6 which is provided with a depth indicated by h and a width indicated by w. Furthermore, the expression "high-aspect-ratio" in the disclosure generally refers to a ratio between the depth h and the width w.

Figure 2:
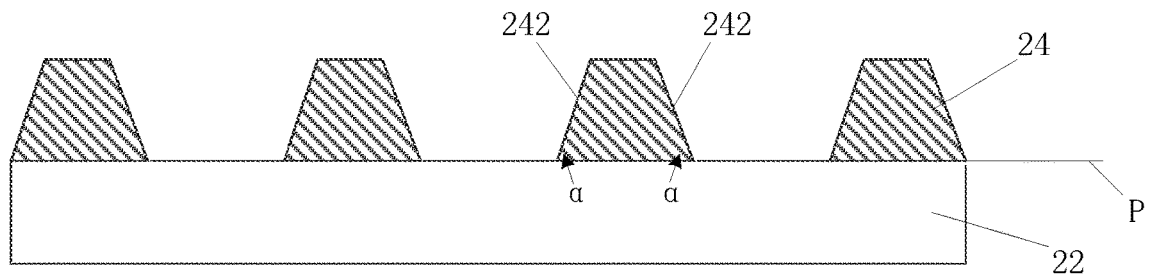
FIG. 2 illustrates a structural schematic view of a female mold, according to an exemplary embodiment of the disclosure.

In the embodiment as illustrated in FIG. 1, a side portion 42 of each of the plurality of molding portions 4 is perpendicular to an upper surface of the substrate 2, i.e., a plane P as illustrated in FIG. 1; and it should be understood therefrom that the female mold as illustrated in FIG. 1 is used to form patterns of vertical constructions. FIG. 2 illustrates a structural schematic view of another female mold, according to an exemplary embodiment of the disclosure. The female mold as illustrated therein comprises a substrate 22 and a plurality of molding portions 24. As illustrated in FIG. 2, two side portions 242 of each of the plurality of molding portions 24 extending from the substrate are both inclined to an upper surface of the substrate 22; in other words, each side portion 242 is inclined at an oblique angle to the plane P. Alternatively, at least one side portion 242 of each of the plurality of molding portions 24 may be inclined to the plane P. In the embodiment as illustrated in FIG. 2, each of the molding portions is shaped in a form of an isosceles trapezoid, i.e., each of both base angles thereof is shaped to be an angle α as illustrated. In other embodiments, for example, two side portions 242 of each of the plurality of molding portions 24 are formed to be at different oblique angles to the plane P; or alternatively, one of the two side portions 242 is inclined to the plane P while the other one of the two side portion 242 is perpendicular to the plane P. It may be understood that, the female mold as illustrated in FIG. 2 is used to form patterns of inclined construction, for example.

Figure 3:
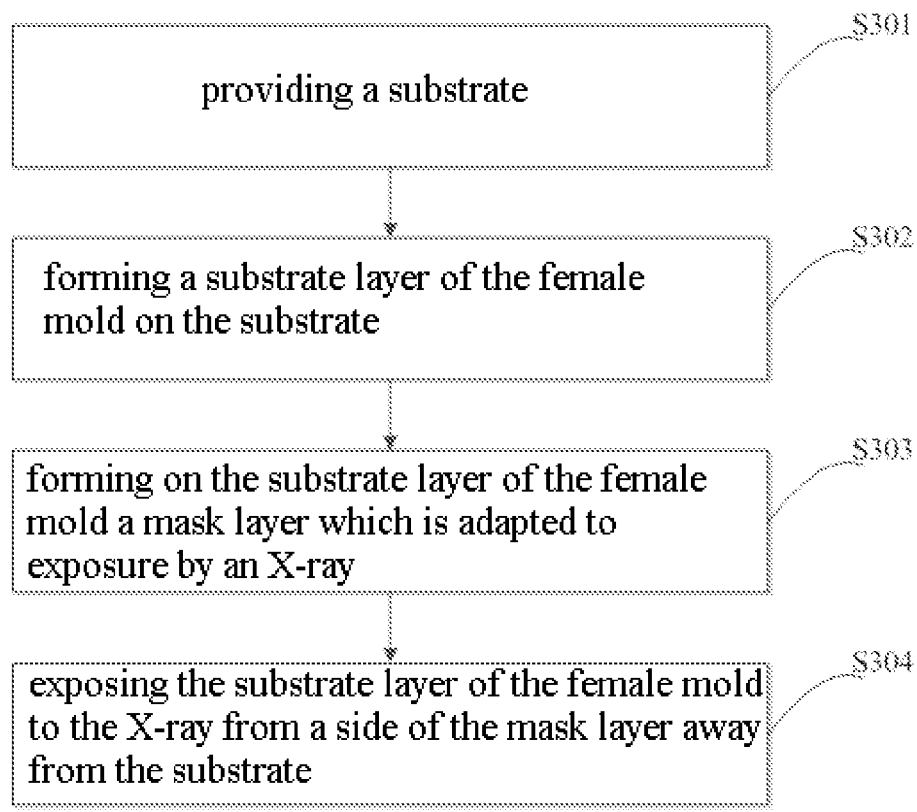
FIG. 3 illustrates a flow chart of a method for manufacturing a female mold, according to an exemplary embodiment of the disclosure.

FIG. 3 illustrates a flow chart of a method for manufacturing a female mold, according to an exemplary embodiment of the disclosure. According to a general technical concept of the present disclosure, as illustrated in FIG. 3, there is provided a method for manufacturing a female mold, e.g., comprising following steps:

S301: providing a substrate;
S302: forming a substrate layer of the female mold on the substrate;
S303: forming on the substrate layer of the female mold a mask layer which is adapted to exposure by an X-ray; and
S304: exposing the substrate layer of the female mold to the X-ray from a side of the mask layer away from the substrate.

And in the process of exposing to the X-ray, a direction in which the X-ray irradiates is inclined at a predetermined oblique angle to the substrate layer of the female mold.

Then, the method for manufacturing the female mold is set forth in detail hereinafter, in view of FIG. 4 of the disclosure.

Figure 4:
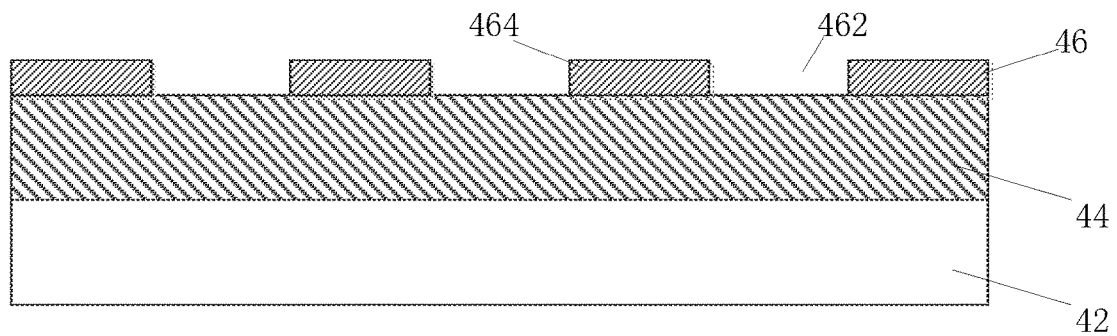
FIG. 4 illustrates exemplarily a schematic view of a structure formed in the method for manufacturing the female mold according to the exemplary embodiment of the disclosure.

In the step S301, a substrate 42 is provided, as illustrated in FIG. 4; the substrate 42 is for example a glass substrate.

In the step S302, a substrate layer 44 of the female mold is formed on the substrate 42. In an exemplary embodiment, the substrate layer 44 of the female mold is for example formed by one of a positive photoresist and a negative photoresist which is adapted to the exposure process by the X-ray, such as PMMA, SU-8 photoresist, and the like.

In the step S303, a mask layer 46, which is adapted to exposure by an X-ray, is formed on the substrate layer 44 of the female mold. As illustrated in FIG. 4, the mask layer 46 comprises a plurality of light-transmitting regions 462 which may for example be hollowed or transparent, and a plurality of light-shielding regions 464 which are solid so as to block the X-ray from passing therethrough. The mask layer 46 functions as a photo mask for subsequent exposure process by the X-ray, at least the plurality of light-shielding regions 464 of which may generally be formed by an X-ray resistance material, e.g., a material having a relatively high atomic sequence value and a relative high density, such as Au, Pt and the like.

According to an embodiment of the disclosure, the step S303 may for example further comprise following steps:

S3031: forming an X-ray resistance material layer on the substrate layer of the female mold;
S3032: applying a photoresist on the X-ray resistance material layer;
S3033: forming patterns of the photoresist by exposure and development processes;
S3034: etching the X-ray resistance material layer; and
S3035: removing the photoresist.

Figure 5:
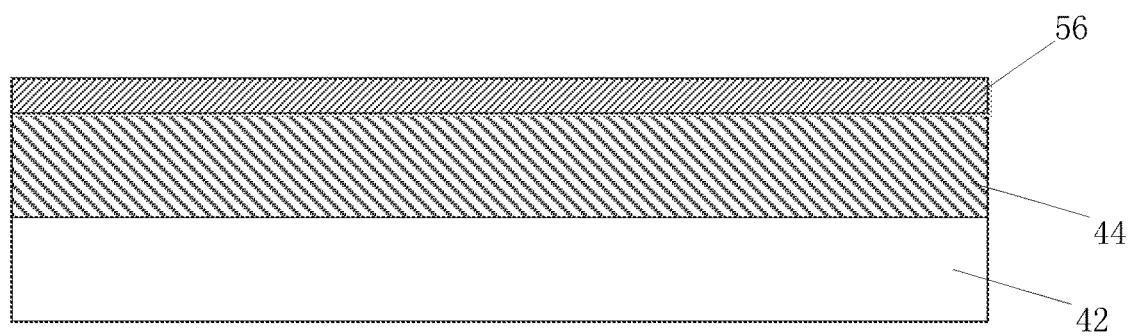
FIGS. 5-8 illustrate exemplarily schematic views of structures formed in various steps of the method for manufacturing the female mold according to the exemplary embodiment of the disclosure, respectively.

Specifically, in the step S3031, an X-ray resistance material layer 56 which may for example be formed by aforementioned X-ray resistance material such as Pt, Au and the like, on the substrate layer 44 of the female mold, as illustrated in FIG. 5; the X-ray resistance material layer 56 is a material layer which covers a whole upper surface of the substrate layer 44 of the female layer.

Figure 6:
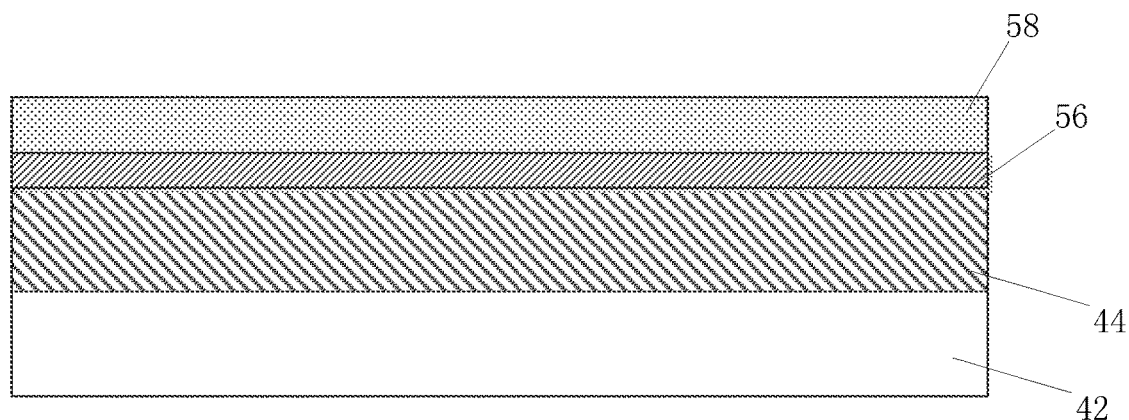

In the step S3032, a photoresist 58 is applied onto the X-ray resistance material layer, as illustrated in FIG. 6; the photoresist 58 is a material layer which covers a whole upper surface of the X-ray resistance material layer 56. In an exemplary embodiment of the disclosure, the photoresist 58 is for example an UV photoresist, i.e., a photoresist which is adapted to exposure by an ordinary UV light.

Figure 7:
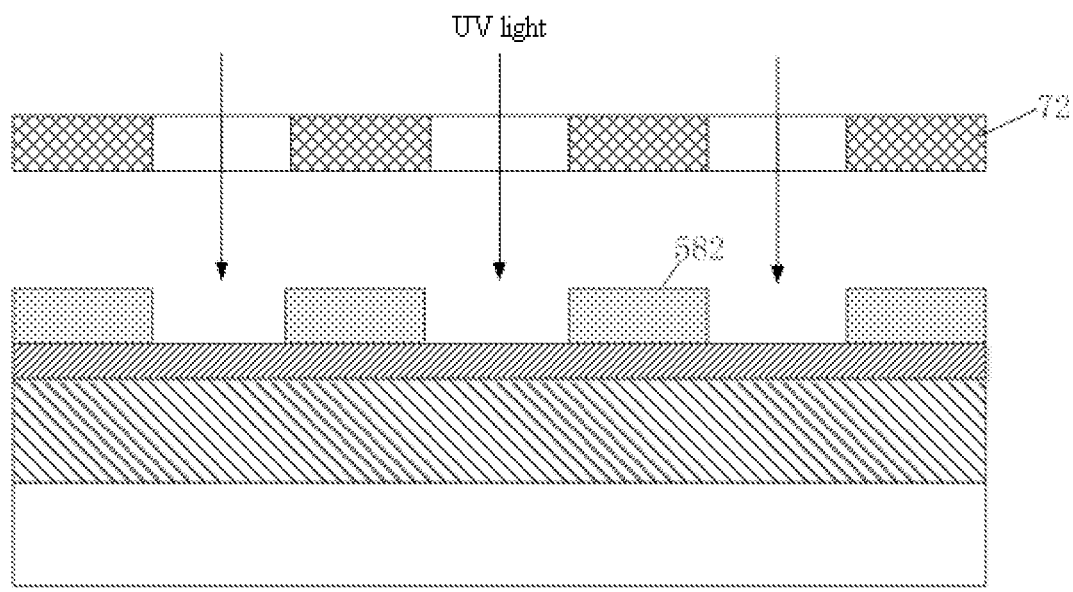

In the step S3033, patterns 582 of the photoresist are formed by exposure and development processes, by means of a photo mask 72, as illustrated in FIG. 7. In an exemplary embodiment, the UV photoresist which is for example applied is exposed to the ordinary UV-light.

Figure 8:
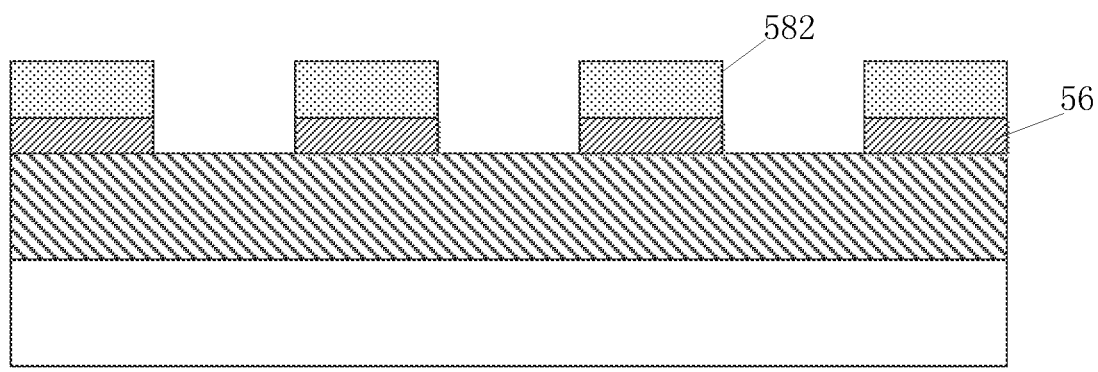

In the step S3034, the X-ray resistance material layer 56 is etched, such that the X-ray resistance material layer 56 is formed with patterns thereof substantially the same as the patterns 582 of the photoresist, as illustrated in FIG. 8.

In the step S3035, the photoresist as illustrated in FIG. 8 is removed, such that the mask layer 46 as illustrated in FIG. 4 is formed.

In the embodiment, patterns of the X-ray resistance material layer are formed by a single patterning process so as to form the mask layer comprising the plurality of light-transmitting regions and the plurality of light-shielding regions. In such a patterning process, the mask layer may alternatively be formed by an exposure way of a projection exposure in addition to the ordinary UV light, i.e., a combination between the projection exposure and the UV-light exposure; as a result, a cost for manufacturing the female mold may be decreased.

Figure 9:
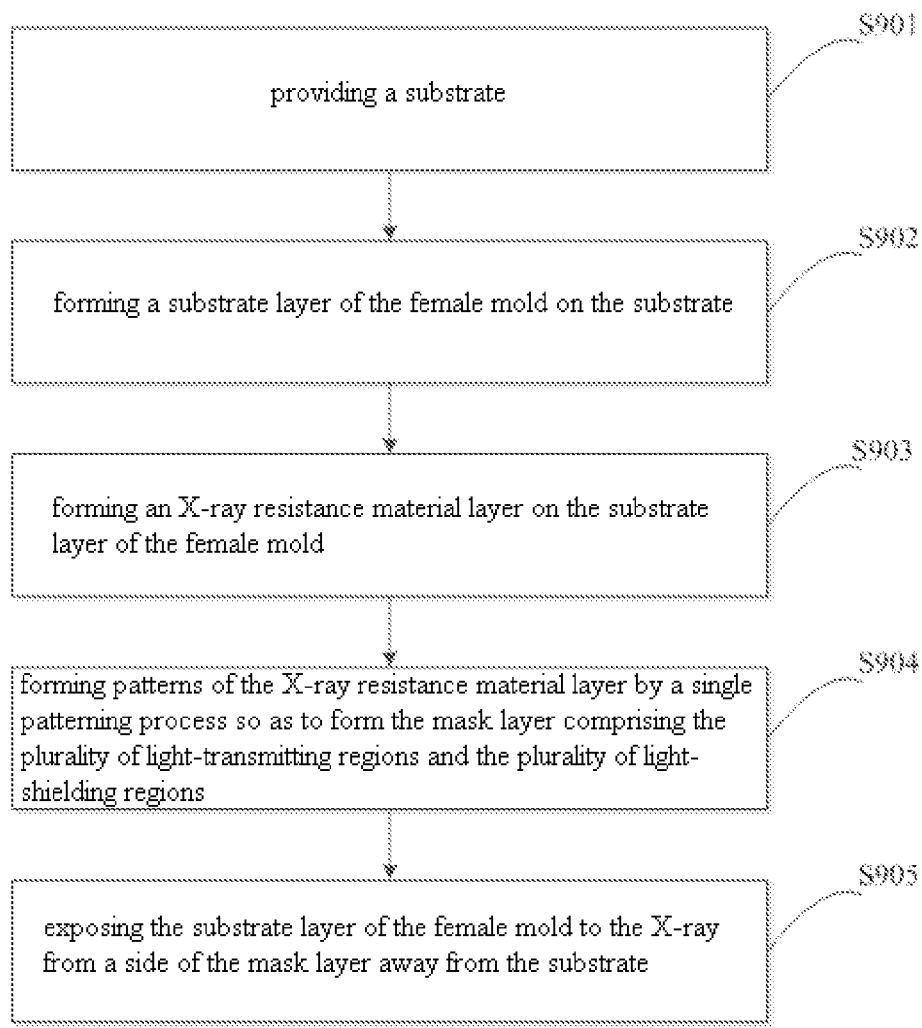
FIG. 9 illustrates a flow chart of a method for manufacturing the female mold, according to another exemplary embodiment of the disclosure.

As such, as illustrated in FIG. 9, alternatively, the method for manufacturing the female mold according to an embodiment of the disclosure may for example further comprise following steps:

S901: providing a substrate;
S902: forming a substrate layer of the female mold on the substrate;
S903: forming an X-ray resistance material layer on the substrate layer of the female mold;
S904: forming patterns of the X-ray resistance material layer by a single patterning process so as to form the mask layer comprising the plurality of light-transmitting regions and the plurality of light-shielding regions; and S905: exposing the substrate layer of the female mold to the X-ray from a side of the mask layer away from the substrate.

And in the process of exposing to the X-ray, a direction in which the X-ray irradiates is inclined at a predetermined oblique angle to the substrate layer of the female mold.

Then, above steps S304 and/or S905 may be set forth in detail hereinafter by referring to FIGS. 10-13 of the description.

Figure 10:
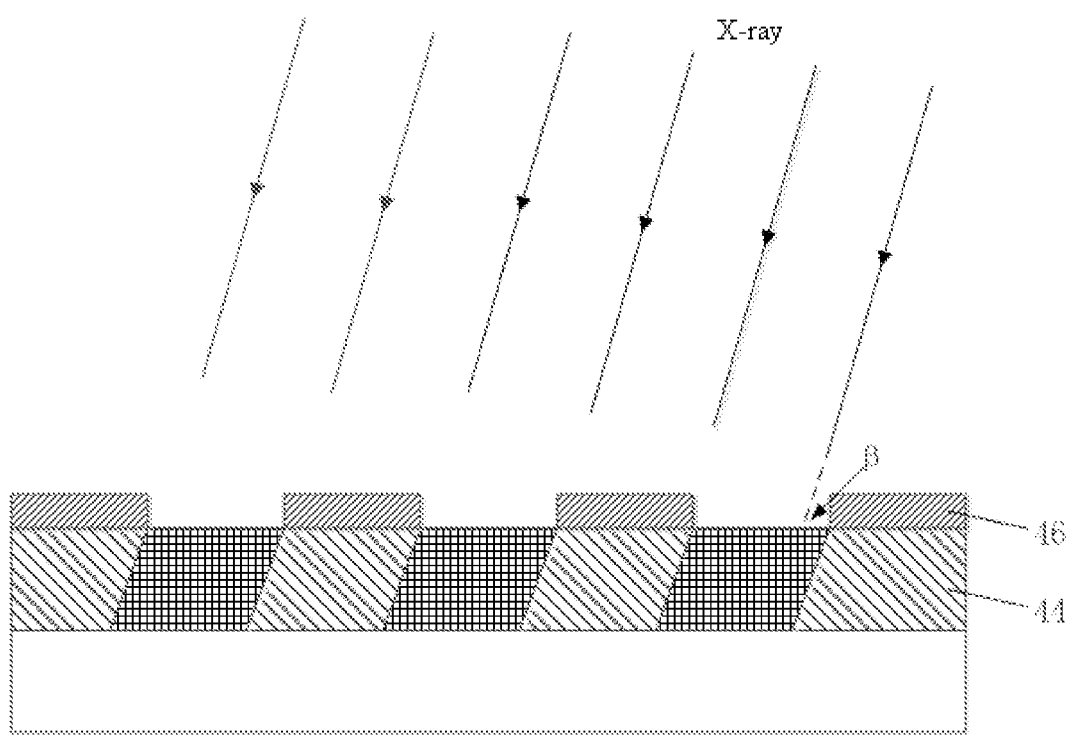
FIG. 10 illustrates a schematic view of a first exposure process in the method for manufacturing the female mold, according to the embodiment of the disclosure.
Figure 11:
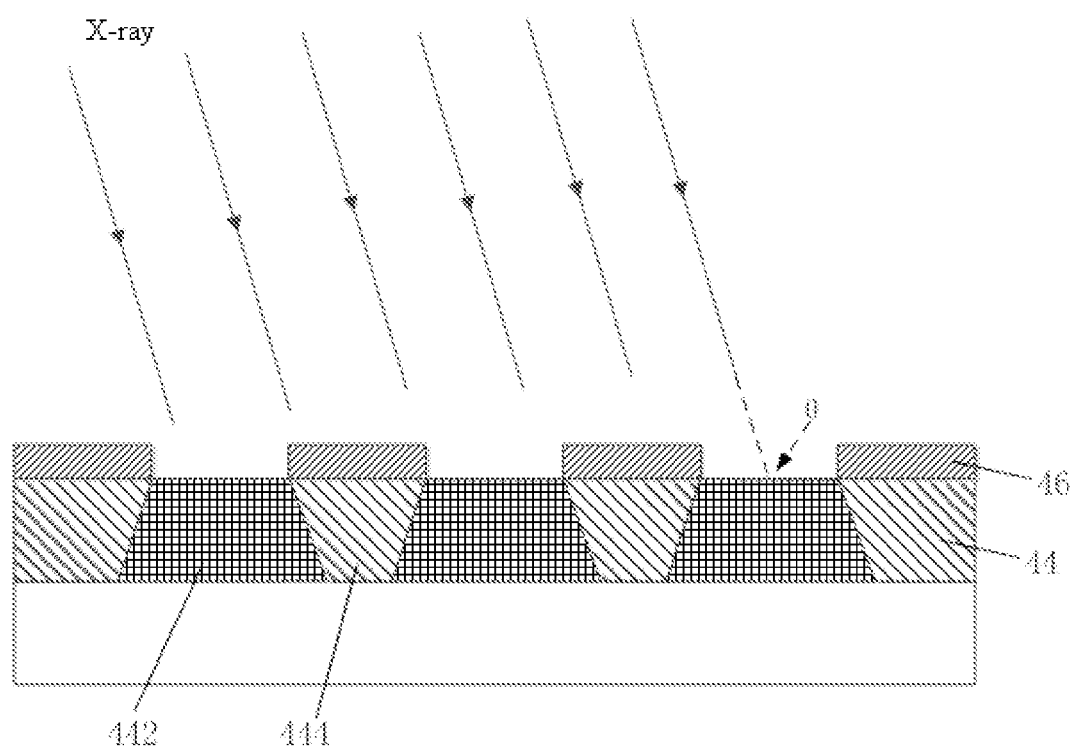
FIG. 11 illustrates a schematic view of a second exposure process in the method for manufacturing the female mold, according to the embodiment of the disclosure.

In the step S304 and/or S905, above all, the substrate layer 44 of the female mold is irradiated by the X-ray in a direction in which the X-ray irradiates is inclined at a first predetermined oblique angle to the substrate layer 44 of the female mold to implement a first exposure, as illustrated in FIG. 10. Then, the substrate layer 44 of the female mold is irradiated by the X-ray in a direction in which the X-ray irradiates is inclined at a second predetermined oblique angle to the substrate layer 44 of the female mold to implement a second exposure, as illustrated in FIG. 11. In each of the two exposure processes, the mask layer 46, which is formed on the substrate layer of the female mold by precedent steps S301-S303 or S901-S904, is used to function as the photo mask for subsequent exposure process by the X-ray to implement the exposure, i.e., each of the two exposure processes is a contact exposure.

In this disclosure, said "first predetermined oblique angle" and said "second predetermined oblique angle" all refer to angles between a direction in which the X-ray or X-light irradiates and the upper surface of the substrate layer 44 of the female mold. To be specific, by way of example, the "first predetermined oblique angle" refers to the angle β as illustrated in FIG. 10, and the "second predetermined oblique angle" refers to the angle θ as illustrated in FIG. 11.

In an exemplary embodiment, the first predetermined oblique angle β is not equal to the second predetermined oblique angle θ. In an exemplary embodiment, the first predetermined oblique angle is an acute angle which is less than 90°, while the second predetermined oblique angle is an obtuse angle which is larger than 90° but less than 180°. As such, in both exposure processes, the X-ray for example irradiates the substrate layer 44 of the female mold in two different directions on opposite sides of a normal of the upper surface of the substrate layer 44 of the female mold. Specifically, as illustrated in FIG. 10, the X-ray irradiates the substrate layer 44 of the female mold in a first irradiation direction from upper right to lower left; while as illustrated in FIG. 11, the X-ray irradiates the substrate layer 44 of the female mold in a second irradiation direction from upper left to lower right, such that a structure in a form of a trapezoid or a quasi-trapezoidal shape may hereby be formed in the substrate layer 44 of the female mold. In the illustrated exemplary embodiments, by way of example, a sum of the first predetermined oblique angle and the second predetermined oblique angle is equal to 180°, i.e., β+=180°; more specifically, e.g., β=60° while θ=120°. In other words, the two irradiation directions of the first exposure and the second exposure of the X-ray are supplementary angles. As a result, for example, a structure in a form of an isosceles trapezoid is formed in the substrate layer 44 of the female mold.

Figure 12:
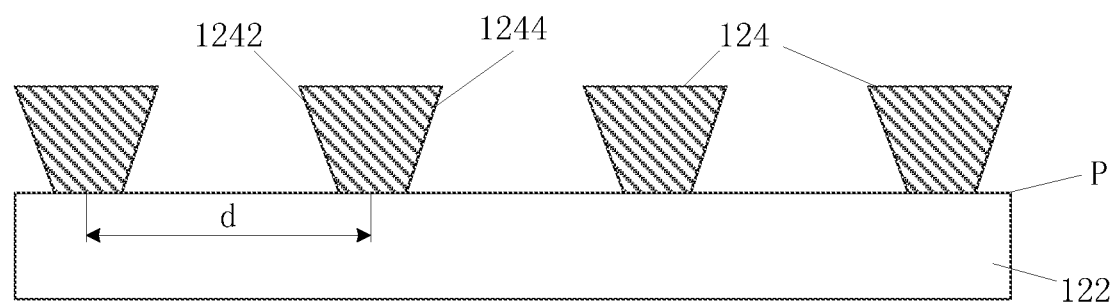
FIG. 12 illustrates a structural schematic view of a female mold manufactured by the method for manufacturing the female mold, according to the embodiment of the disclosure.

According to an embodiment of the disclosure, following the step S304 and/or S905, i.e., following the step of exposing the substrate layer of the female mold to the X-ray from a side of the mask layer away from the substrate, by way of example, the method further comprises: etching the mask layer while developing the substrate layer of the female mold simultaneously; or alternatively, etching the mask layer and then developing the substrate layer of the female mold subsequently. As such, the plurality of molding portions 124 may be formed, as illustrated in FIG. 12. Specifically, a wet etching process may for example be adopted to etch the mask layer.

Above steps are set forth in more detail hereinafter, by taking a substrate layer of the female mold which substrate layer is formed by PMMA material for example.

As illustrated in FIG. 10, the substrate layer 44 of the female mold is irradiated by the X-ray in a direction in which the X-ray irradiates is inclined at a first predetermined oblique angle β to the substrate layer 44 of the female mold to implement a first exposure; and the substrate layer 44 of the female mold is irradiated by the X-ray in a direction in which the X-ray irradiates is inclined at a second predetermined oblique angle θ to the substrate layer 44 of the female mold to implement a second exposure. Then, the mask layer 46 is etched by the wet etching process, as illustrated in FIG. 11, while the substrate layer 44 of the female mold is developed simultaneously. Alternatively, e.g., the mask layer 46 is etched by the wet etching process above all, and then the substrate layer 44 of the female mold is developed subsequently. Since the substrate layer 44 of the female mold is formed by a positive photoresist, e.g., PMMA, a portion of the substrate layer 442 of the female mold which is subjected to exposure already in the two exposure processes as illustrated in FIG. 11 may be dissolved by a developing solution, while the other portion of the substrate layer 444 of the female mold which is not exposed as illustrated in FIG. 11 may be preserved/remained after the developing step. As such, after above etching and developing steps, the female mold as illustrated in FIG. 12 is thus formed. As shown in FIG. 12, the female mold has a substrate 122 and a plurality of molding portions 124, each of the plurality of molding portions 124 being formed in a form of an inverted-trapezoid structure relative to the substrate.

Figure 13:
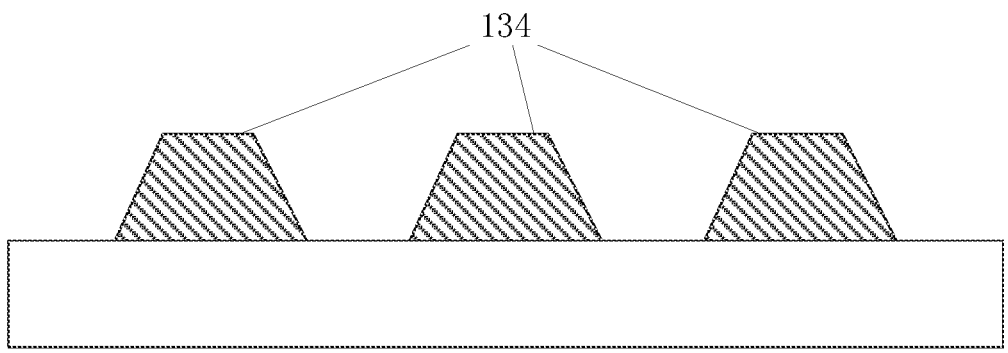
FIG. 13 illustrates a structural schematic view of another female mold manufactured by the method for manufacturing the female mold, according to the embodiment of the disclosure.

It should be understood that, when the substrate layer 44 of the female mold is formed by a negative photoresist, the female mold 134 which is provided with a regular-trapezoid structure by above method for manufacturing the female mold, as illustrated in FIG. 13.

In above embodiment, by the exposure with a short wavelength light like the X-ray, micro-structures each having a relatively large depth or a relative large high-aspect-ratio may be manufactured; besides, the two exposures are all inclined exposures which is capable of forming micro-structures each having two inclined side surfaces, on the female mold, so as to implement a manufacturing of complex micro-structures each having a large depth and a certain oblique angle.

According to another embodiment of the disclosure, above step S304 and/or S905 may for example comprise following steps: adjusting the first predetermined oblique angle β and the second predetermined oblique angle θ such that, within an identical light-transmitting region, after the first exposure and the second exposure, since the X-rays adopted for these two exposures respectively may intersect each other and thus fail to transmit into an entire volume within the single light-transmitting region, then there is a unexposed area formed between two exposed areas on the substrate layer of the female mold both of which are processed by the first exposure and the second exposure respectively. By way of example, in an exemplary embodiment, in consideration of a relationship between the predetermined oblique angles β, θ and a thickness of the substrate layer of the female mold, the first predetermined oblique angle β and the second predetermined oblique angle θ are adjusted. For example, as compared with the β, θ as illustrated in FIGS. 10 and 11, the first predetermined oblique angle β and the second predetermined oblique angle θ are decreased respectively; in other words, the X-ray in the two directions on opposite sides may irradiate the substrate layer of the female mold in more inclined directions. As such, in an embodiment, β=30°, θ=150°.

Figure 14:
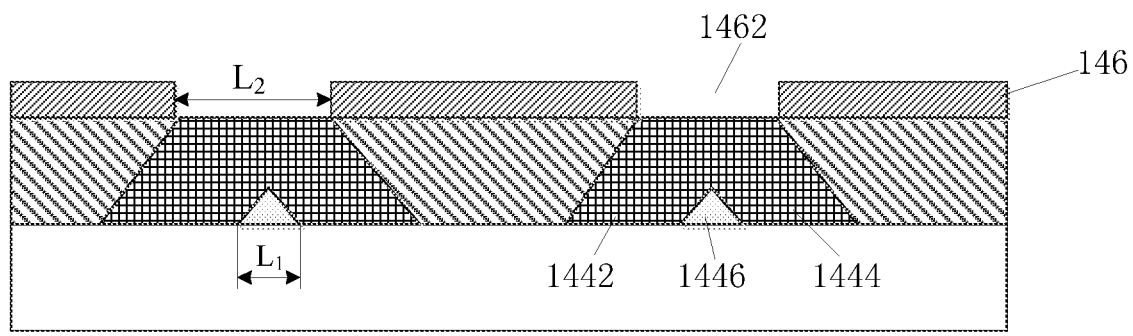
FIG. 14 illustrates exemplarily a schematic view of a structure formed in the method for manufacturing the female mold according to another exemplary embodiment of the disclosure.

In this manner, within an identical light-transmitting region 1462 of the mask layer 146, there is a unexposed area 1446 which is formed between and not contained by two exposed areas 1442, 1444 on the substrate layer of the female mold both of which are processed by the first exposure and the second exposure respectively, as illustrated in FIG. 14. As illustrated in FIG. 14, a dimension of the unexposed area 1446 in a direction parallel to the substrate is less than a dimension of one of the exposed areas 1462 on the mask layer; in other words, a length L1 of the unexposed area 1446 is less than a length L2 of the exposed area 1462. By such a step, a resolution of the female mold thus manufactured is higher than that of the mask layer, such that the resolution of the micro-structures manufactured by the female mold may in turn be increased.

In above embodiment, by way of example, the substrate layer of the female mold formed on the substrate has a thickness over 5 μm, so as to facilitate a manufacturing of micro-structures each having a large depth or a large high-aspect-ratio.

According to an embodiment of the disclosure, a female mold is provided, as illustrated in FIG. 12, e.g., comprising:
  a substrate 122; and
  a plurality of molding portions 124 formed on the substrate 122.

And the plurality of molding portions 124 are spaced apart from one another by a predetermined distance d at bottom portions thereof, respectively, for example; and each of the plurality of molding portions 124 has at least one of side portions 1242, 1244 inclined to the plane P in which the substrate lies.

In the embodiment as illustrated in FIG. 12, each of the plurality of molding portions 124 is provided with an inverted trapezoidal shape relative to the substrate. In other embodiments, each of the plurality of molding portions 124 is for example provided with a specific shape relative to the substrate, e.g., one of a triangular shape, a regular trapezoidal shape, or a quasi-trapezoidal shape and the like.

In an embodiment, by way of example, each of the plurality of molding portions has a thickness over 5 μm, and/or the plurality of molding portions 124 comprise one of a positive photoresist and a negative photoresist which is adapted to the exposure process by the X-ray.

Figure 15:
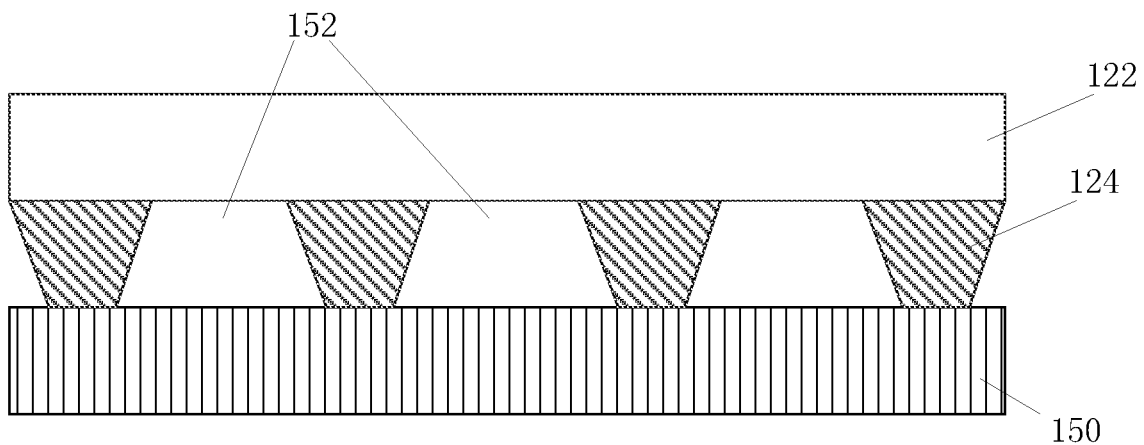
FIG. 15 illustrates exemplarily a schematic view of a device having micro-structures which are manufactured by the female mold formed according to the exemplary embodiment of the disclosure.

FIG. 15 illustrates exemplarily a schematic view of a device of micro-structures which are manufactured by the female mold formed according to the exemplary embodiment of the disclosure.

According to an embodiment, e.g., a device comprising micro-structures may for example be manufactured by the female mold which is formed by the nano-imprint lithography technology according to the embodiments of the disclosure. The nano-imprint lithography technology may form nano-scale patterns directly and mechanically on a material like the photoresist by taking advantage of physics mechanism, provided that neither electrons nor photons may be used. Just due to this mechanical action, the nano-imprint lithography technology may not be restricted by diffraction of photons or scattering of electrons any more, such that nano-scale patterns of a large area may be prepared massively and extensively. By way of example, the nano-imprint lithography technology comprises: hot embossing, RNIL, UV-NIL, UCP, R-NIL, CNP and LADI, and the like. The embodiments of the disclosure are set forth in more detail hereinafter by taking the hot embossing for example.

As illustrated in FIG. 15, the method for manufacturing the device having the micro-structures which may be formed by above female mold according to an embodiment of the disclosure may for example comprise following steps:
  manufacturing a female mold according to above method, which female mold comprises a substrate 122 and a plurality of molding portions 124 as illustrated in FIG. 12;
  selecting a hot embossing glue which is for example RMMA;
  heating the hot embossing glue to a temperature over a glass transition temperature;
  compression molding: engaging the female mold matingly with the substrate 150 of the device which device is to be manufactured, and pressurizing thereon at a constant temperature such that gaps among molding portions of the female mold are filled with the hot embossing glue which is flowing;
  cooling: cooling to a temperature below the glass transition temperature of the hot embossing glue, so as to cure patterns of micro structures 152;
  demoulding: separating the micro structures 152 thus formed from the female mold; and
  etching: removing residual hot embossing glue layer by an etching method such as a dry etching and the like, so as to form micro structures 152 which have shapes complementary to those of the plurality of molding portions of the female mold respectively.

In the embodiments of the disclosure, by adopting an exposure process which combines the projection exposure and the contact exposure, and by further utilizing a double inclined exposure in the contact exposure, a female mold which has a predetermined oblique angle or predetermined oblique angles may hereby be manufactured. The usage of the female mold may favorably facilitate a manufacturing of micro-structures each having a large depth or a large high-aspect-ratio.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for manufacturing a female mold, comprising steps of:

providing a substrate;

forming a substrate layer of the female mold on the substrate;

forming on the substrate layer of the female mold a mask layer which is adapted to exposure by an X-ray; and exposing the substrate layer of the female mold to the X-ray from a side of the mask layer away from the substrate, twice, wherein a direction in which the X-ray irradiates is inclined at a respective one of only two predetermined oblique angles to the substrate layer of the female mold, in the process of exposing to the X-ray each time;

wherein the substrate layer of the female mold is formed by a negative photoresist which is adapted to the exposure process by the X-ray;

wherein the step of exposing the substrate layer of the female mold to the X-ray from a side of the mask layer away from the substrate comprises:

irradiating the substrate layer of the female mold by the X-ray in a direction of irradiation of the X-ray that is inclined at a first predetermined oblique angle of the two predetermined oblique angles to the substrate layer of the female mold to implement a first exposure; and irradiating the substrate layer of the female mold by the X-ray in a direction of irradiation of the X-ray that is inclined at a second predetermined oblique angle of the two predetermined oblique angles to the substrate layer of the female mold to implement a second exposure;

wherein the first predetermined oblique angle is not equal to the second predetermined oblique angle;

wherein the mask layer comprises a plurality of light-transmitting regions, and a plurality of light-shielding regions which are configured to block the X-ray from passing therethrough, and the step of exposing the substrate layer of the female mold to the X-ray from a side of the mask layer away from the substrate further comprises:

adjusting the first predetermined oblique angle and the second predetermined oblique angle such that, within an identical light-transmitting region of the mask layer, there is an unexposed area formed between two exposed areas on the substrate layer of the female mold both of which are processed by the first exposure and the second exposure respectively, and the unexposed area is formed on a side of the substrate layer of the female mold which side faces towards the substrate and is in contact with the substrate; and wherein a dimension of the unexposed area in a direction parallel to the substrate is less than a dimension of one of the exposed areas on the mask layer in the direction parallel to the substrate.

2. The method according to claim 1, wherein the first predetermined oblique angle is an angle which is less than 90°, while the second predetermined oblique angle is an angle which is larger than 90° but less than 180°.

3. The method according to claim 2, wherein a sum of the first predetermined oblique angle and the second predetermined oblique angle is equal to 180°.

4. The method according to claim 1, wherein the step of forming on the substrate layer of the female mold a mask layer which is adapted to exposure by an X-ray comprises:

forming an X-ray resistance material layer on the substrate layer of the female mold; and forming patterns of the X-ray resistance material layer by a single patterning process so as to form the mask layer comprising the plurality of light-transmitting regions and the plurality of light-shielding regions.

5. The method according to claim 4, wherein the step of forming patterns of the X-ray resistance material layer by a single patterning process comprises:

applying a photoresist on the X-ray resistance material layer;

forming patterns of the photoresist by exposure and development processes;

etching the X-ray resistance material layer; and removing the photoresist.

6. The method according to claim 5, wherein the photoresist applied on the X-ray resistance material layer is an UV photoresist; and wherein in the step of forming patterns of the photoresist by exposure and development processes, the UV photoresist which is applied is exposed to an UV-light.

7. The method according to claim 6, wherein in the step of forming patterns of the photoresist by exposure and development processes, the UV photoresist which is applied is exposed by a projection exposure in addition to the UV light.

8. The method according to claim 1, wherein following the step of exposing the substrate layer of the female mold to the X-ray from a side of the mask layer away from the substrate, the method further comprises:

etching the mask layer while developing the substrate layer of the female mold simultaneously.

9. The method according to claim 1, wherein the substrate layer of the female mold formed on the substrate has a thickness over 5 μm.

10. A female mold which is manufactured by the method according to claim 1.

11. The method according to claim 1, wherein following the step of exposing the substrate layer of the female mold to the X-ray from a side of the mask layer away from the substrate, the method further comprises:

etching the mask layer and then developing the substrate layer of the female mold subsequently.

* * * * *